(12) United States Patent
Savignac et al.

(10) Patent No.: US 6,426,899 B1
(45) Date of Patent: Jul. 30, 2002

(54) INTEGRATED MEMORY WITH A BUFFER CIRCUIT

(75) Inventors: Dominique Savignac, Ismaning; Robert Feurle, Neubiberg; Helmut Schneider, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/594,911

(22) Filed: Jun. 15, 2000

Related U.S. Application Data

(63) Continuation of application No. PCT/DE98/03306, filed on Nov. 11, 1998.

(30) Foreign Application Priority Data

Dec. 15, 1997 (DE) .......................................... 197 55 737

(51) Int. Cl.$^7$ ................................................. G11C 7/00
(52) U.S. Cl. .............. 365/189.05; 365/149; 365/230.08
(58) Field of Search ............................ 365/149, 230.08, 365/189.05

(56) References Cited

U.S. PATENT DOCUMENTS

| | | | |
|---|---|---|---|
| 3,753,001 A | | 8/1973 | Hiroshima et al. |
| 5,241,503 A | * | 8/1993 | Cheng .......................... 365/205 |
| 5,675,547 A | * | 10/1997 | Koga .......................... 365/149 |
| 5,761,112 A | * | 6/1998 | Murray et al. ............... 365/149 |
| 5,771,189 A | * | 6/1998 | Jun et al. ..................... 365/149 |

FOREIGN PATENT DOCUMENTS

| | | |
|---|---|---|
| CA | 1 158 711 | 12/1983 |
| JP | 63 257 088 | 10/1988 |
| JP | 02 292 797 | 12/1990 |
| JP | 05 276 683 | 10/1993 |
| JP | 05 284 670 | 10/1993 |

OTHER PUBLICATIONS

Anonymous: "Active Low Dissipation Power Supply Regulator", IBM Technical Disclosure Bulletin, Sep. 1969, XP-002103045.

Askin, H. O. et al.: "Bit line bias circuit with high-noise immunity", IBM Technical Disclosure Bulletin, vol. 17, No. 10, Mar. 1975, pp. 2923–2924.

Tietze, U. et al.: "Halbleiter–Schaltungstechnik" [semiconductor control technology], Springer Verlag, Berlin, Germany, 1980, 5$^{th}$ ed., pp. 8–13.

Catolog of Conrad electronic, Hirschau, Germany: "Electronic Welt '96 [electronic Welt '96" ], p. 609.

* cited by examiner

*Primary Examiner*—Son T. Dinh
(74) *Attorney, Agent, or Firm*—Laurence A. Greenberg; Werener H. Stemer; Gregory L. Mayback

(57) ABSTRACT

An integrated memory includes two potential nodes at which a supply voltage is present. Memory cells each have a selection transistor and a storage capacitor. At least one series circuit is disposed between the two potential nodes. The series circuits each have at least one buffer capacitor and one associated transistor. The associated transistor effects current limiting in the event of a defect in the at least one buffer capacitor. Each of the buffer capacitor and associated transistor have a mutual configuration and dimensions like the selection transistor and storage capacitor of one of the memory cells and have only an electrical connection differing from the selection transistor and storage capacitor.

8 Claims, 2 Drawing Sheets

INTEGRATED MEMORY WITH A BUFFER CIRCUIT

CROSS-REFERENCE TO RELATED APPLICATION

This application is a continuation of copending International Application No. PCT/DE98/03306, filed Nov. 11, 1998, which designated the United States.

BACKGROUND OF THE INVENTION

Field of the Invention

The invention relates to an integrated memory including two potential nodes at which a supply voltage is present, and memory cells each having a selection transistor and a storage capacitor. Such memories are generally known, for example, as DRAMS (Dynamic Random Access Memories).

In order to counteract dips in supply voltages of integrated circuits in the event of severe loads that occur suddenly or due to a momentary failure of voltage supplies, it is known to provide buffer capacitors for buffering the supply voltage. Those buffer capacitors are generally disposed in such a way that the entire supply voltage to be buffered is dropped across the buffer capacitor. It can happen that capacitor electrodes are not completely insulated from one another due to production faults or due to overvoltages that occur during operation. Therefore, a leakage or short-circuit current driven by the supply voltage flows through the capacitor. That can lead to a dip in the supply voltage. Such a defect can cause the entire integrated circuit to be rendered unusable.

The problem is further aggravated when the capacitance required for buffering is obtained by connecting numerous capacitors in parallel. A defect in just a single one of the capacitors then suffices to render the entire chip unusable due to the associated short circuit of the supply voltage.

In Patent Abstracts of Japan, Vol. 018, No. 073 (E-1503), Feb. 7, 1994, relating to JP 05-284 670 A, a buffer circuit for a battery supply of an IC is described, which has two RC series circuits connected in parallel.

SUMMARY OF THE INVENTION

It is accordingly an object of the invention to provide an integrated memory with a buffer circuit for a supply voltage, which overcomes the hereinafore-mentioned disadvantages of the heretofore-known devices of this general type and in which impairment of the integrated memory due to a defect occurring in the buffer circuit is avoided to the greatest possible extent.

With the foregoing and other objects in view there is provided, in accordance with the invention, an integrated memory, comprising two potential nodes at which a supply voltage is present; memory cells each including a selection transistor and a storage capacitor; at least one series circuit disposed between the two potential nodes, the at least one series circuit each having at least one buffer capacitor and one associated transistor, the associated transistor effecting current limiting in the event of a defect in the at least one buffer capacitor; each of the at least one buffer capacitor and associated transistor having a mutual configuration and dimensions like the selection transistor and storage capacitor of one of the memory cells and having only an electrical connection differing from the selection transistor and storage capacitor.

The buffer circuit according to the invention has a series circuit formed by a high-value resistance element and a buffer capacitor and the supply voltage to be buffered is present across the series circuit. If there is a defect in the buffer capacitor, the total resistance of the buffer circuit results from the sum of the short-circuit resistance of the capacitor and the resistance of the resistance element. If the resistance of the resistance element is chosen to be sufficiently high, this prevents an excessively large current from flowing through the buffer circuit in the event of a defect. The resistance element is dimensioned in such a way that the leakage current occurring in the event of a defect in the capacitor is limited to a desired maximum value. Therefore, even when the buffer circuit can no longer perform its buffering function due to a defect in the capacitor, it is possible to maintain the supply voltage prior to the collapse, with the result that the integrated circuit can continue to be used.

By way of example, the high-value resistance element may be a non-reactive resistor or a transistor. The resistance of the resistance element can be variable through a control terminal. Such a resistance element may be realized e.g. by a transistor or a variable non-reactive resistor.

In accordance with another feature of the invention, in the last-mentioned case, the buffer circuit has a control circuit, which controls the resistance of the resistance element through its control terminal. This has the advantage of permitting its resistance to be adapted to specific desires or defects that occur in the capacitor.

In accordance with a further feature of the invention, the control circuit is a voltage regulator which controls the resistance of the resistance element in a manner dependent on the potential at the second potential node. In this case, in the event of a dip in the supply voltage due to a defect in the buffer capacitor, the resistance is increased in an expedient manner until the leakage current flowing through the series circuit no longer appreciably impairs the supply voltage.

In accordance with an added feature of the invention, the control circuit is a current regulator which controls the resistance of the resistance element in a manner dependent on the current flow through the series circuit. That effect corresponds to that of the embodiment outlined above. The advantage of both embodiments is that the buffer circuit reacts flexibly to defects which occur in its capacitor. It may be provided that the voltage or current regulator only increases the resistance of the resistance element when the potential at the second node has fallen by a minimum amount, or when the leakage current has reached a minimum intensity.

In accordance with an additional feature of the invention, the control circuit is an adjustable voltage source which, at its output, generates an output voltage that is adjustable through a control input, and the output is connected to the control terminal of the resistance element. The output voltage of the voltage source is adjustable either once or repeatedly. It can be chosen after or in the course of the process for producing the buffer circuit or the integrated circuit including it. That may be done in such a way that the resistance of the transistor is adapted to production-dictated influences which have been ascertained beforehand or to defects that have been ascertained in the buffer capacitor. In this way, it is possible to preclude production-dictated influences on the function of the buffer circuit and to compensate for defects that have been ascertained. The adjustable voltage source may be programmable, for example.

In accordance with a concomitant feature of the invention, the buffer circuit has at least two series circuits each having a buffer capacitor and a high-value resistance element, wherein all of these series circuits are connected in parallel with one another, and the supply voltage to be buffered is dropped across this parallel circuit. This development has the advantage that in the event of a defect affecting individual capacitors, the short-circuit current thereof is limited in each case by the resistance element associated with them. Thus, due to the resistance element, a low-resistance short circuit in parallel with the intact series circuits is not produced. Therefore, the action of the intact buffer capacitors remains unaffected by the failure of the defective buffer capacitors. The supply voltage is then buffered by the buffer capacitors which are still intact. If there is a large number of series circuits connected in parallel and only a few of them fail, the total capacitance of the parallel circuit is hardly reduced as compared with the case in which all of the capacitors are intact.

If the integrated memory circuit having a supply voltage which is intended to be buffered is an integrated memory circuit having memory cells each including a selection transistor and a storage capacitor (as is the case with DRAMs, for example), it is particularly advantageous to dimension the buffer circuit in exactly the same way as the memory cells, and the individual series circuits of the buffer circuit differ from the memory cells only by the way in which they are electrically connected. Since the memory cells of memory circuits are always configured in an optimized manner with respect to area, an area-optimized configuration of the buffer circuit is obtained in this way at no great cost. The buffer circuit can be produced with only minor changes by using the layout of the memory cells.

In the last-mentioned embodiment of the invention, the high-value resistance element is a correspondingly connected transistor. A non-reactive resistor, for example, may also be involved in other embodiments of the invention.

Other features which are considered as characteristic for the invention are set forth in the appended claims.

Although the invention is illustrated and described herein as embodied in an integrated memory with a buffer circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
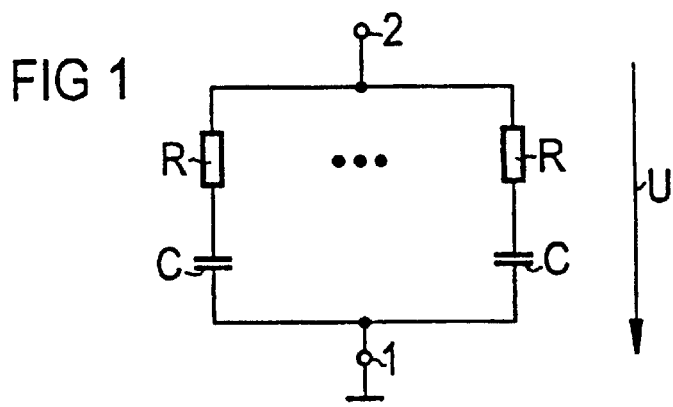
FIGS. 1 to 3 are schematic circuit diagrams of exemplary embodiments of a buffer circuit according to the invention.

Referring now to the figures of the drawings in detail and first, particularly, to FIG. 1 thereof, there is seen a first exemplary embodiment of a buffer circuit, in which a supply voltage U of an integrated circuit is dropped between a first potential node 1 and a second potential node 2. The buffer circuit for buffering the supply voltage U is part of the integrated circuit. A multiplicity of series circuits which are connected in parallel with one another and each of which has a high-value non-reactive resistor R and a buffer capacitor C, are disposed between the two potential nodes 1, 2. In FIG. 1, the first potential node 1 is connected to ground and the second potential node 2 is connected to a positive supply potential. In other embodiments of the invention, the potential of the second potential node may be negative, or the potential assignment of the two potential nodes 1, 2 may be interchanged.

If the capacitance of the individual buffer capacitors C in FIG. 1 is very low, a large number of the illustrated series circuits is required in order to obtain a sufficiently large total capacitance for buffering the supply voltage U. If the capacitance of each of the capacitors C is 50 fF, for example, 500,000 series circuits are required in order to obtain a total capacitance of about 25 nF. In other embodiments, it is also possible, of course, to provide just one of the series circuits shown in order to realize the buffer circuit.

The high-value resistor R serves to limit the current through the corresponding series circuit in the event of a defect in the capacitor C associated therewith. The defect may be formed, for example, by the dielectric of the capacitor being broken down by an overvoltage. The resistance of the series circuit then results from the sum of the resistance of the resistor R and the short-circuit resistance of the defective capacitor C. If the capacitors C have a capacitance of 50 fF, it has proved to be advantageous to provide a resistance of approximately 500 k$\Omega$ for the resistor R, in order to achieve sufficient current limiting in the event of a defect.

As a result of the resistors R effecting the high-resistance current limiting according to the invention in the event of a defect, the defective series circuits do not impair the functioning of the intact series circuits. As a result, the supply voltage U continues to be buffered by the intact series circuits and their buffer capacitors C.

By virtue of the fact that the value of the resistor R is chosen to be very large, the current flowing through the capacitor C in the event of a defect is virtually independent of its generally small short-circuit resistance. The high-value resistor R by itself provides for significant short-circuit current limiting.

Figure 2:
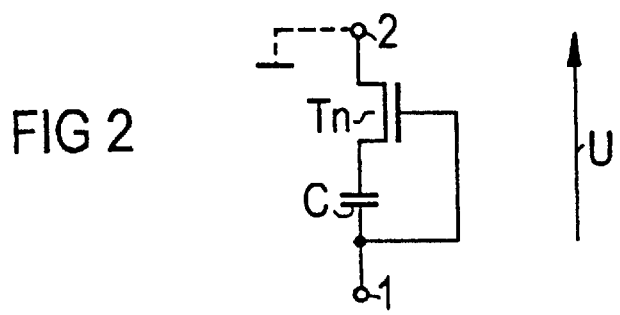

FIG. 2 shows one of the series circuits from FIG. 1 as a second exemplary embodiment of the buffer circuit, in which the non-reactive resistor R is replaced by an n-channel transistor $T_n$ having a gate that is connected to the first potential node 1. The transistor $T_n$ is dimensioned in such a way that it has a very high resistance. The buffer circuit according to FIG. 2 is suitable for buffering the supply voltages U in which the potential at the first potential node 1 is greater than that at the second potential node 2.

Figure 3:
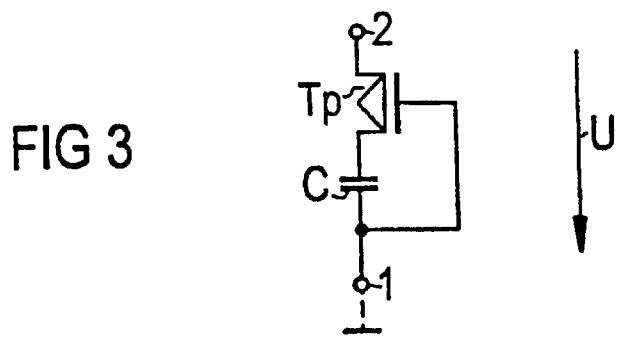

FIG. 3 shows a realization of a third exemplary embodiment of the buffer circuit, which differs from that in FIG. 2 only with respect to the type of the high-resistance transistor. A P-channel transistor $T_p$ is involved in FIG. 3. This circuit is suitable for buffering a positive supply voltage U between the second potential node 2 and the first potential node 1.

Figure 4:
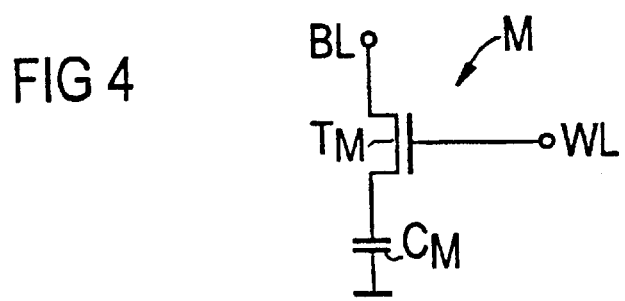
FIG. 4 is a circuit diagram showing a DRAM memory cell.

FIG. 4 shows a memory cell M of a dynamic memory (DRAM). This memory cell has a series circuit formed by a selection transistor $T_M$ and a storage capacitor $C_M$ between a bit line BL and ground. In the embodiment shown, the selection transistor $T_M$ is of the n-channel type and has a gate connected to a word line WL of the memory. It is particularly advantageous if the buffer circuit in accordance with FIG. 2 is produced with the aid of the layout for the memory cell M in FIG. 4. It is then necessary to merely replace the external connections of the memory cell M to the bit line BL, to the word line WL and to ground by the electrical connections which can be gathered from FIG. 2. The outer form of the transistor and of the capacitor as well as their electrical connection for producing the series circuit remain unchanged in this case. If the memory cell M shown in FIG. 4 has already been electrically optimized and minimized with respect to area, when its only slightly modified layout is used to produce the buffer circuit in FIG. 2, the result is a buffer circuit which is likewise optimized electrically and in terms of area.

The values which are further specified by way of example above (capacitance of the capacitor C=25 fF, resistance of the transistor $T_n$=500 kΩ) can also be realized in the case of the subject matter shown in FIG. 2. In order to obtain a total capacitance of 25 nF, once again 500,000 of the series circuits shown in FIG. 2 are connected in parallel.

Figure 5:
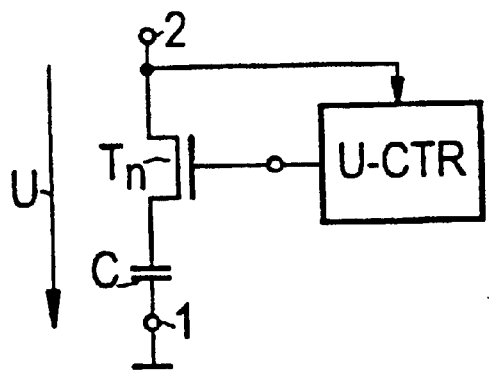
FIGS. 5 to 7 are circuit diagrams showing embodiments of the buffer circuit with different control circuits.

FIG. 5 shows an exemplary embodiment of the buffer circuit, in which the resistance of the transistor $T_n$ is controlled through the use of a voltage regulator U-CTR. The voltage regulator U-CTR has an input connected to the second potential node 2 and an output connected to the control terminal of the transistor. In the event of a defect in the capacitor C, that is to say when a leakage current occurs in the series circuit, the voltage regulator increases the resistance until the leakage current has become negligibly small and no longer appreciably influences the voltage U to be buffered. In the extreme case, the voltage regulator turns the transistor off completely, with the result that leakage current can no longer flow through the series circuit.

Figure 6:
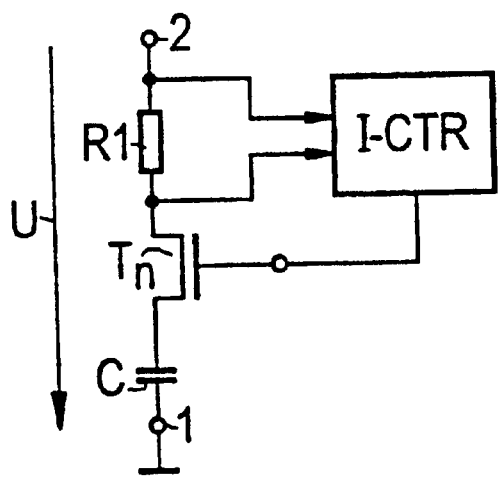

FIG. 6 shows a buffer circuit in which the resistance of the transistor $T_n$ is controlled by a current regulator I-CTR. The series circuit between the two potential nodes 1, 2 has a measuring resistor R1, with a resistance which is known very precisely. Such a precisely set measuring resistor can be realized e.g. by metallic interconnects. The current regulator detects the voltage dropped across the measuring resistor and determines the current flowing through the series circuit from the voltage and the (known) value of the measuring resistor. If, in the process, it ascertains an impermissibly high current which can only stem from a defect in the capacitor C, it increases the resistance of the transistor until the current no longer exceeds a defined maximum value. In the extreme case, the current regulator turns the transistor off completely.

Figure 7:
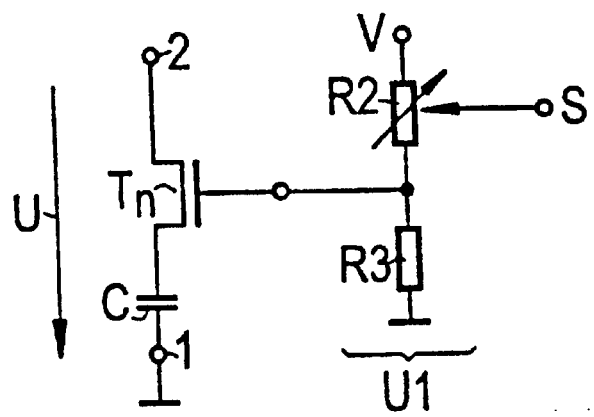

FIG. 7 shows a buffer circuit with an adjustable voltage source U1, which supplies an adjustable output voltage at its output that is connected to the control terminal of the transistor $T_n$. The voltage source U1 is a voltage divider formed by two non-reactive resistors R2, R3, one of which has an adjustable resistance which can be chosen by a control input S of the voltage source. A signal at the control input S can be predetermined by an operator of the buffer circuit. It can be set by programmable elements (e.g. fuses), for example. The setting can be performed, for example, in a manner dependent on the production process, with the result that the resistance of the transistor is independent of the production process. The influence of the production process on the electrical properties of the transistor can be ascertained e.g. through the use of test structures produced on the same wafer as the buffer circuit.

We claim:

1. An integrated memory, comprising:
   two potential nodes at which a supply voltage is present;
   memory cells each including a selection transistor and a storage capacitor;
   at least one series circuit disposed between said two potential nodes, said at least one series circuit each having at least one buffer capacitor and one associated transistor, said associated transistor effecting current limiting in the event of a defect in said at least one buffer capacitor;
   each of said at least one buffer capacitor and associated transistor having a mutual configuration and dimensions like said selection transistor and storage capacitor of one of said memory cells and having only an electrical connection differing from said selection transistor and storage capacitor.

2. The integrated memory according to claim 1, wherein said transistor has a control terminal connected to said first potential node.

3. The integrated memory according to claim 2, wherein said transistor is an n-channel field-effect transistor, and said first potential node has a greater potential than said second potential node.

4. The integrated memory according to claim 2, wherein said transistor is a p-channel field-effect transistor, and said first potential node has a lower potential than said second potential node.

5. The integrated memory according to claim 1, wherein said transistor has a control terminal and a resistance, and a control circuit controls the resistance of said transistor through the control terminal.

6. The integrated memory according to claim 5, wherein said control circuit is a voltage regulator controlling the resistance of said transistor to be dependent on a potential at said second potential node.

7. The integrated memory according to claim 5, wherein said control circuit is a current regulator controlling the resistance of said transistor to be dependent on a current flow through said at least one series circuit.

8. The integrated memory according to claim 5, wherein said control circuit is an adjustable voltage source having a control input and an output generating an output voltage adjustable through said control input, and said output is connected to the control terminal of said transistor.

* * * * *